US012627280B2

(12) United States Patent
Ikeuchi et al.

(10) Patent No.: US 12,627,280 B2
(45) Date of Patent: May 12, 2026

(54) INCREASED DIELECTRIC FILM THICKNESS REFLECTOR IN A TEMPERATURE COMPENSATED SURFACE ACOUSTIC WAVE RESONATOR

(71) Applicant: SKYWORKS SOLUTIONS, INC., Irvine, CA (US)

(72) Inventors: Satoru Ikeuchi, Ashiya (JP); Joji Fujiwara, Suita (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 155 days.

(21) Appl. No.: 18/422,883

(22) Filed: Jan. 25, 2024

(65) Prior Publication Data

US 2024/0267028 A1     Aug. 8, 2024

Related U.S. Application Data

(60) Provisional application No. 63/442,833, filed on Feb. 2, 2023.

(51) Int. Cl.
| | |
|---|---|
| *H03H 9/25* | (2006.01) |
| *H03H 9/02* | (2006.01) |
| *H03H 9/64* | (2006.01) |
| *H04B 1/00* | (2006.01) |

(52) U.S. Cl.
CPC .......... *H03H 9/25* (2013.01); *H03H 9/02834* (2013.01); *H03H 9/02992* (2013.01); *H03H 9/64* (2013.01); *H04B 1/0057* (2013.01)

(58) Field of Classification Search
CPC .. H03H 9/25; H03H 9/02834; H03H 9/02992; H03H 9/64; H04B 1/0057
USPC ......................................................... 333/193
See application file for complete search history.

(56) References Cited

U.S. PATENT DOCUMENTS

| | | | |
|---|---|---|---|
| 9,035,725 B2 * | 5/2015 | Komatsu | ............ H03H 9/02858 |
| | | | 333/193 |
| 11,309,867 B2 * | 4/2022 | Urata | ................. H03H 9/02834 |

\* cited by examiner

*Primary Examiner* — Andrea Lindgren Baltzell
*Assistant Examiner* — Abigail Amir Yaldo
(74) *Attorney, Agent, or Firm* — Lando & Anastasi, LLP

(57)     ABSTRACT

Aspects and embodiments disclosed herein include an acoustic wave device comprising a substrate, a pair of IDT electrodes formed on the substrate, fingers of one IDT electrode arranged interleaved with fingers of the other IDT electrode, reflectors formed on the substrate, one of the reflectors being adjacent to one side of the pair of IDT electrodes and another reflector being adjacent to the opposite side of the pair of IDT electrodes so as to interpose the pair of IDT electrodes therebetween, the reflectors and the pair of IDT electrodes arranged along a propagation direction of a main acoustic wave, and a dielectric film covering the pair of IDT electrodes and the reflectors, the dielectric film having a first thickness covering at least a portion of the reflectors, the dielectric film having a second thickness covering the pair of IDT electrodes, the first thickness being different from the second thickness.

19 Claims, 15 Drawing Sheets

700

500

INTERSECTION AREA

504

402

401

411

412

600

604

402

401

411

412

INCREASED DIELECTRIC FILM THICKNESS REFLECTOR IN A TEMPERATURE COMPENSATED SURFACE ACOUSTIC WAVE RESONATOR

CROSS-REFERENCE TO RELATED APPLICATIONS

This application claims priority under 35 U.S.C. § 119(e) to U.S. Provisional Patent Application Ser. No. 63/442,833, titled "INCREASED DIELECTRIC FILM THICKNESS REFLECTOR IN A TEMPERATURE COMPENSATED SAW RESONATOR," Feb. 2, 2023, the entire content of which is incorporated herein by reference for all purposes.

BACKGROUND

Field

Aspects and embodiments of the present disclosure relate to electronic systems, and in particular, to a filter for use in radio frequency (RF) electronics.

Description of the Related Technology

Filters are used in radio frequency (RF) communication systems to allow signals to pass through at discreet frequencies but reject any frequency outside of the specified range. An acoustic wave filter, which is used widely in the wireless communication field, can include a plurality of resonators arranged to filter a radio frequency signal. Example acoustic wave filters include surface acoustic wave (SAW) filters and/or bulk acoustic wave (BAW) filters. A film bulk acoustic resonator (FBAR) filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter module include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

In accordance with one aspect, there is provided an acoustic wave device. The acoustic wave device comprises a substrate, a pair of IDT electrodes formed on the substrate, each of the pair of IDT electrodes including a bus bar and a plurality of fingers extending from the bus bar, a respective finger of one IDT electrode arranged interleaved with respective fingers of the other IDT electrode, reflectors formed on the substrate, one of the reflectors being adjacent to one side of the pair of IDT electrodes and another reflector being adjacent to the opposite side of the pair of IDT electrodes so as to interpose the pair of IDT electrodes therebetween, the reflectors and the pair of IDT electrodes arranged along a propagation direction of a main acoustic wave, and a dielectric film covering the pair of IDT electrodes and the reflectors, the dielectric film having a first thickness covering at least a portion of the reflectors, the dielectric film having a second thickness covering the pair of IDT electrodes, the first thickness being different from the second thickness.

In some embodiments, the portion of the reflectors covered by the dielectric film of the first thickness is both end portions of each reflector remote from the pair of IDT electrodes.

In some embodiments, inner portions of each reflector adjacent to the pair of IDT electrodes are covered by the dielectric film of the second thickness that is thicker than the first thickness.

In some embodiments, the dielectric film of the first thickness covers an entirety of the reflectors.

In some embodiments, the respective finger of one IDT electrode is separated from an adjacent finger of the other IDT electrode by a first pitch distance, each of the reflectors including a plurality of fingers separated from each other by a second pitch distance which are extending in a same direction of extension as the respective finger of the pair of IDT electrodes.

In some embodiments, the second pitch distance is larger than the first pitch distance.

In some embodiments, the dielectric film is formed of silicon dioxide ($SiO_2$).

In some embodiments, a surface of the dielectric film has a stair shape at a transition region connecting the first thickness and the second thickness of the dielectric film.

In some embodiments, a surface of the dielectric film has a sloped shape at a transition region connecting the first thickness and the second thickness of the dielectric film.

In some embodiments, the portion of the reflectors covered by the dielectric film of the first thickness is an end portion of one of the reflectors remote from the pair of IDT electrodes, and an end portion of the other reflector remote from the pair of IDT electrodes is covered by the dielectric film of a third thickness that is different from the first thickness.

In accordance with another aspect, there is provided a radio frequency module. The radio frequency module comprises a packaging board configured to receive a plurality of components, and an acoustic wave device implemented on the packaging board, the acoustic wave device including a substrate, a pair of IDT electrodes formed on the substrate, each of the pair of IDT electrodes including a bus bar and a plurality of fingers extending from the bus bar, a respective finger of one IDT electrode arranged interleaved with respective fingers of the other IDT electrode, reflectors formed on the substrate, one of the reflectors being adjacent to one side of the pair of IDT electrodes and another reflector being adjacent to the opposite side of the pair of IDT electrodes so as to interpose the pair of IDT electrodes therebetween, the reflectors and the pair of IDT electrodes arranged along a propagation direction of a main acoustic wave, and a dielectric film covering the pair of IDT electrodes and the reflectors, the dielectric film having a first thickness covering at least a portion of the reflectors, and a second thickness covering the pair of IDT electrodes, the first thickness being different from the second thickness.

In some embodiments, the radio frequency module is a front-end module.

In some embodiments, the portion of the reflectors covered by the dielectric film of the first thickness is both end portions of each reflector remote from the pair of IDT electrodes.

In some embodiments, inner portions of each reflector adjacent to the pair of IDT electrodes are covered by the dielectric film of the second thickness that is thicker than the first thickness.

In some embodiments, the dielectric film of the first thickness covers an entirety of the reflectors.

In some embodiments, the respective finger of one IDT electrode is separated from an adjacent finger of the other IDT electrode by a first pitch distance, each of the reflectors including a plurality of fingers separated from each other by a second pitch distance which are extending in a same direction of extension as the respective finger of the pair of IDT electrodes.

In some embodiments, the second pitch distance is larger than the first pitch distance.

In some embodiments, the dielectric film is formed of silicon dioxide (SiO$_2$).

In some embodiments, a surface of the dielectric film has a stair shape at a transition region connecting the first thickness and the second thickness of the dielectric film.

In some embodiments, a surface of the dielectric film has a sloped shape at a transition region connecting the first thickness and the second thickness of the dielectric film.

In some embodiments, the portion of the reflectors covered by the dielectric film of the first thickness is an end portion of one of the reflectors remote from the pair of IDT electrodes, and an end portion of the other reflector remote from the pair of IDT electrodes is covered by the dielectric film of a third thickness that is different from the first thickness.

In accordance with another aspect, there is provided a mobile device. The mobile device comprises an antenna configured to receive a radio frequency signal, and a front end system configured to communicate with the antenna, the front end system including an acoustic wave device including a substrate, a pair of IDT electrodes formed on the substrate, each of the pair of IDT electrodes including a bus bar and a plurality of fingers extending from the bus bar, a respective finger of one IDT electrode arranged interleaved with respective fingers of the other IDT electrode, reflectors formed on the substrate, one of the reflectors being adjacent to one side of the pair of IDT electrodes and another reflector being adjacent to the opposite side of the pair of IDT electrodes so as to interpose the pair of IDT electrodes therebetween, the reflectors and the pair of IDT electrodes arranged along a propagation direction of a main acoustic wave, and a dielectric film covering the pair of IDT electrodes and the reflectors, the dielectric film having a first thickness covering at least a portion of the reflectors, the dielectric film having a second thickness covering the pair of IDT electrodes, the first thickness being different from the second thickness.

In some embodiments, the portion of the reflectors covered by the dielectric film of the first thickness is both end portions of each reflector remote from the pair of IDT electrodes.

In some embodiments, inner portions of each reflector adjacent to the pair of IDT electrodes are covered by the dielectric film of the second thickness that is thicker than the first thickness.

In some embodiments, the dielectric film of the first thickness covers an entirety of the reflectors.

In some embodiments, the respective finger of one IDT electrode is separated from an adjacent finger of the other IDT electrode by a first pitch distance, each of the reflectors including a plurality of fingers separated from each other by a second pitch distance which are extending in a same direction of extension as the respective finger of the pair of IDT electrodes.

In some embodiments, the second pitch distance is larger than the first pitch distance.

In some embodiments, the dielectric film is formed of silicon dioxide (SiO$_2$).

In some embodiments, a surface of the dielectric film has a stair shape at a transition region connecting the first thickness and the second thickness of the dielectric film.

In some embodiments, a surface of the dielectric film has a sloped shape at a transition region connecting the first thickness and the second thickness of the dielectric film.

In some embodiments, the portion of the reflectors covered by the dielectric film of the first thickness is an end portion of one of the reflectors remote from the pair of IDT electrodes, and an end portion of the other reflector remote from the pair of IDT electrodes is covered by the dielectric film of a third thickness that is different from the first thickness.

DETAILED DESCRIPTION OF EMBODIMENTS

Figure 1:
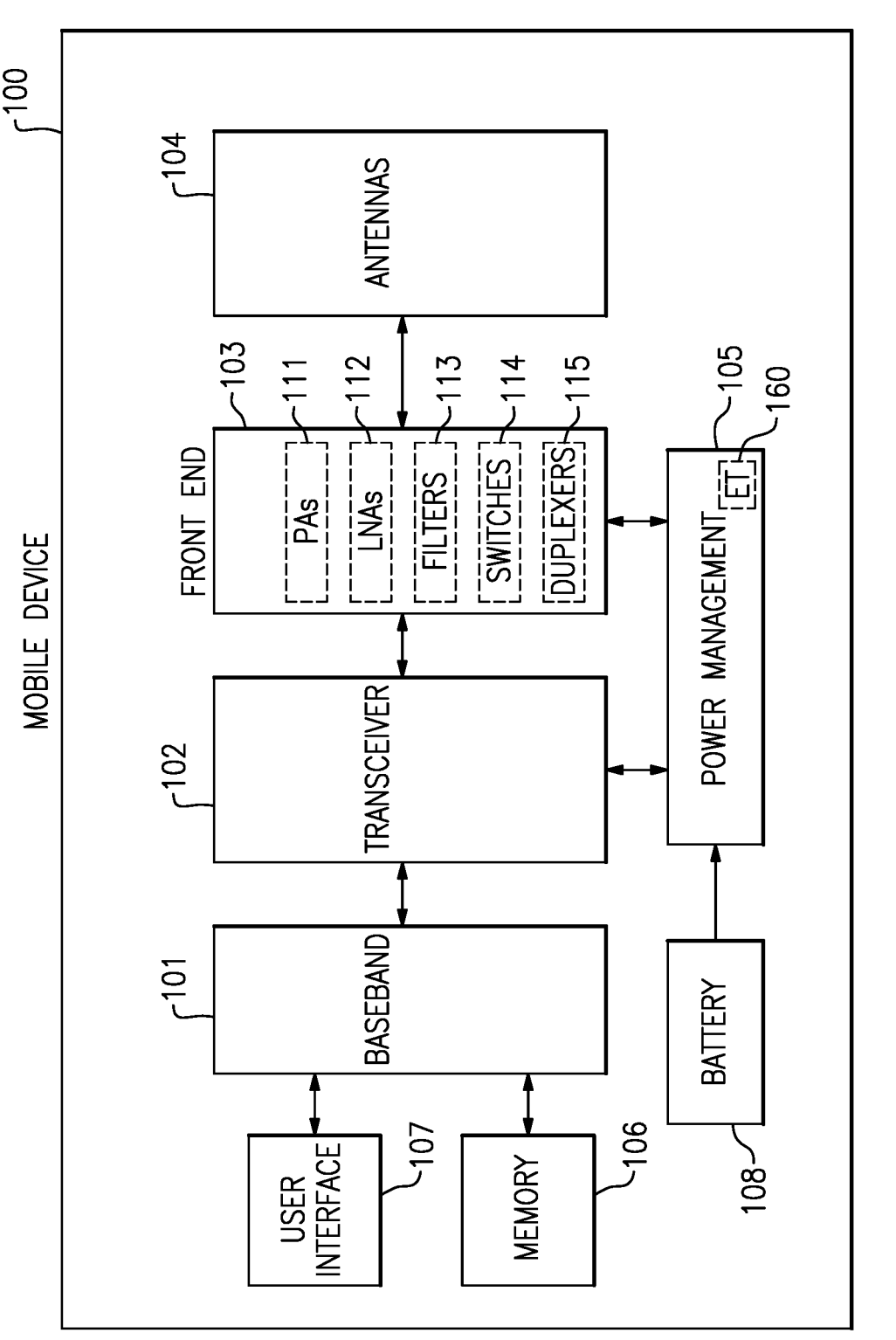
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 101, a transceiver 102, a front end system 103, antennas 104, a power management system 105, a memory 106, a user interface 107, and a battery 108.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 104 can include antennas used for a wide variety of types of communications. For example, the antennas 104 can include antennas associated transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 103 can include phase shifters having variable phase controlled by the transceiver 102. Additionally, the phase shifters can be controlled to provide beam formation and directivity for transmission and/or reception of signals using the antennas 104. For example, in the context of signal transmission, the phases of the transmit signals provided to the antennas 104 can be controlled such that radiated signals from the antennas 104 combine using constructive and destructive interference to generate an aggregate transmit signal exhibiting beam-like qualities with more signal strength propagating in a given direction. In the context of signal reception, the phases can be controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 to facilitate operation of the mobile device 100.

The memory 106 can be used for a wide variety of purposes, such as storing data and/or instructions to facilitate the operation of the mobile device 100 and/or to provide storage of user information.

The power management system 105 provides a number of power management functions of the mobile device 100. The power management system 105 of FIG. 1 includes an envelope tracker 160. As shown in FIG. 1, the power management system 105 receives a battery voltage form the battery 108. The battery 108 can be any suitable battery for use in the mobile device 100, including, for example, a lithium-ion battery.

The mobile device 100 of FIG. 1 illustrates one example of an RF communication system that can include filters implemented in accordance with one or more features of the present disclosure. However, the teachings herein are applicable to RF communication systems implemented in a wide variety of ways.

Figures 2A, 2B:
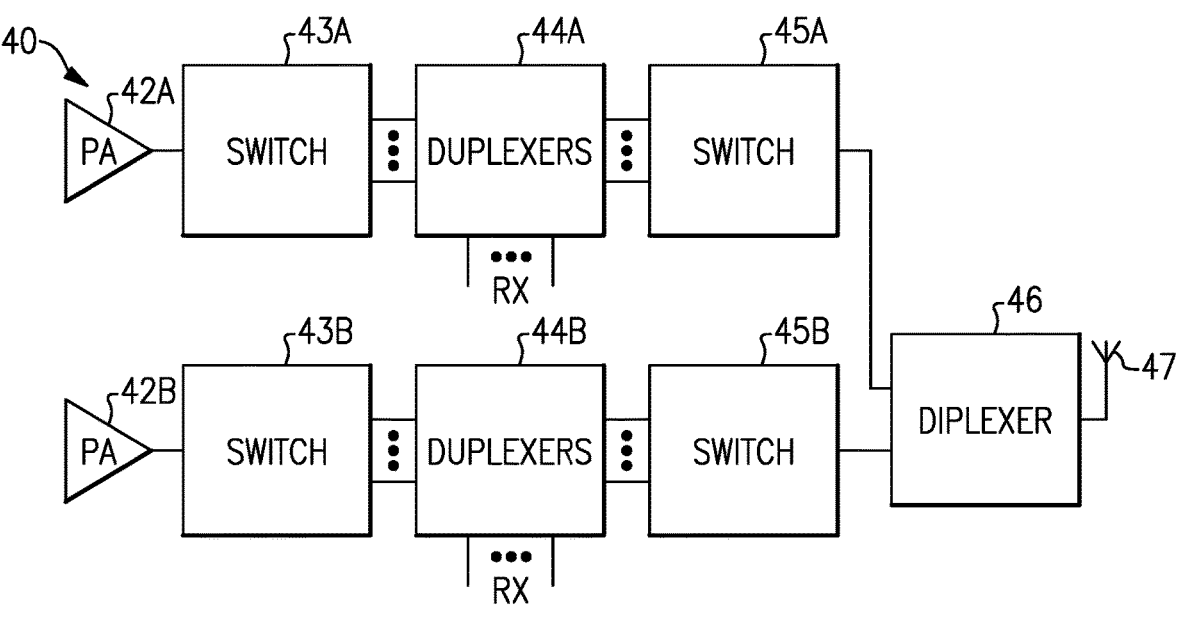
FIG. 2A is a schematic diagram of a carrier aggregation system.
FIG. 2B is a schematic diagram of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexer 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
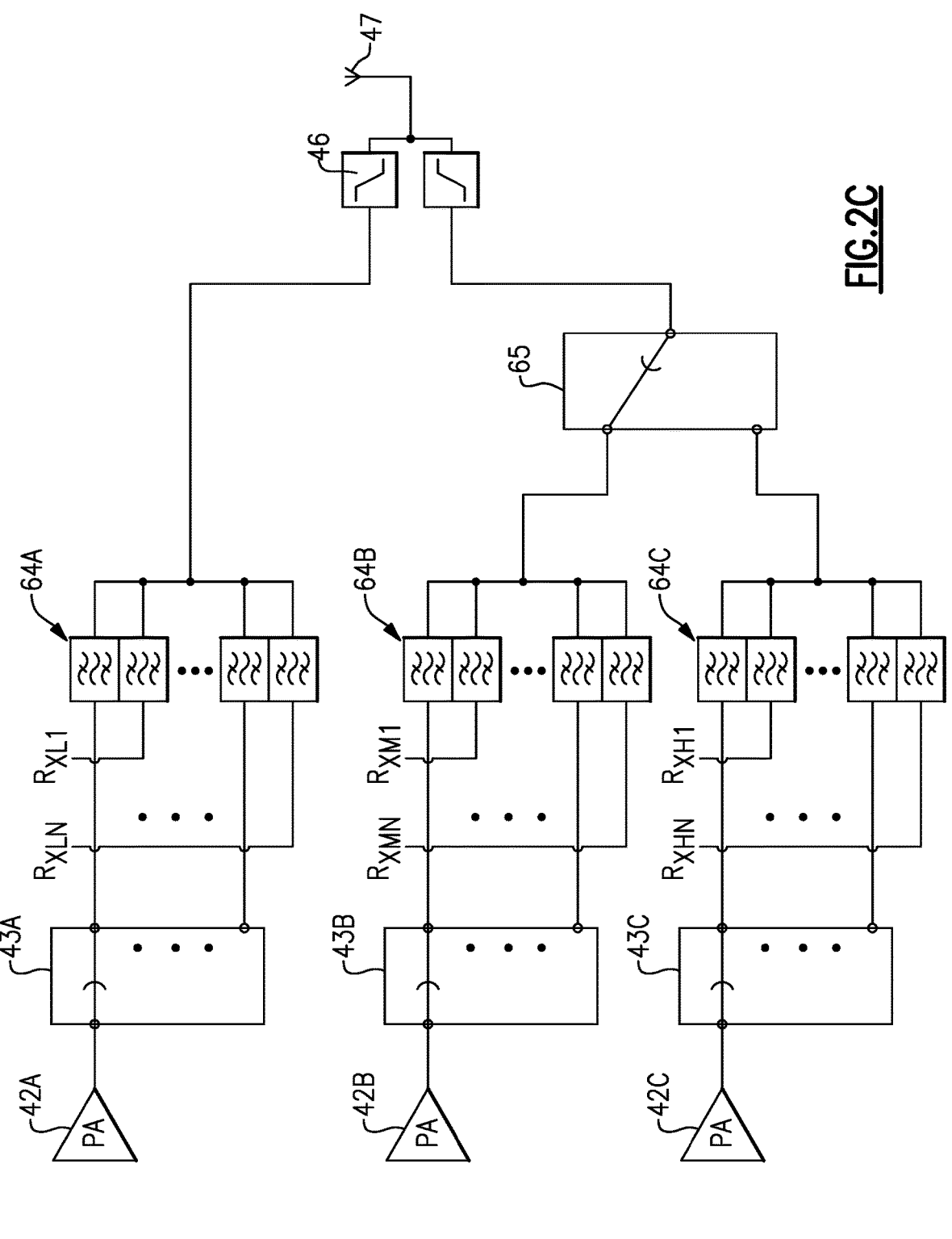
FIG. 2C is a schematic diagram of a carrier aggregation system.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain applications, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz.

A diplexer 46 can be included between RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

Figure 2D:
FIG. 2D is a schematic diagram of a carrier aggregation system.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in multiplexer.

In the illustrated carrier aggregation system 70, duplexers 64B and 64C are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 64B is coupled to separate throws of the switch 75. Similarly, the illustrated duplexers 64C include a plurality of duplexers coupled to separate throws of the switch 75. Alternatively, instead of duplexers being coupled to each throw the switch 75 as illustrated in FIG. 2D, one or more individual filters of a multiplexer can be coupled to a dedicated throw of a switch coupled between the multiplexer and a common node. For instance, in some applications, such a switch could have twice as many throws as the illustrated switch 75.

Figure 3A:
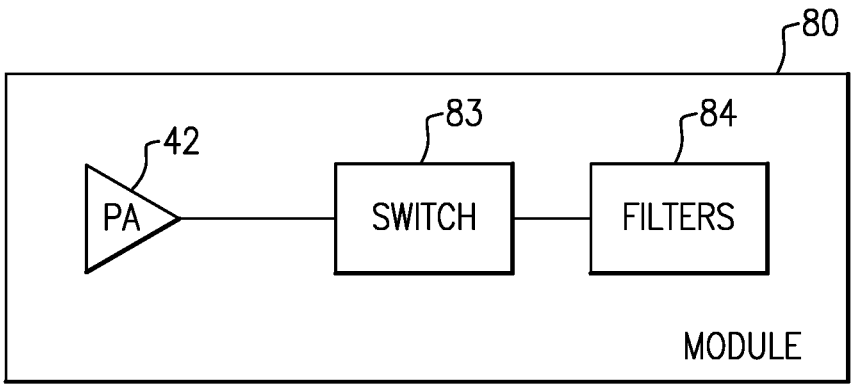
FIG. 3A is a schematic block diagram of a module that includes a filter.
Figure 3B:
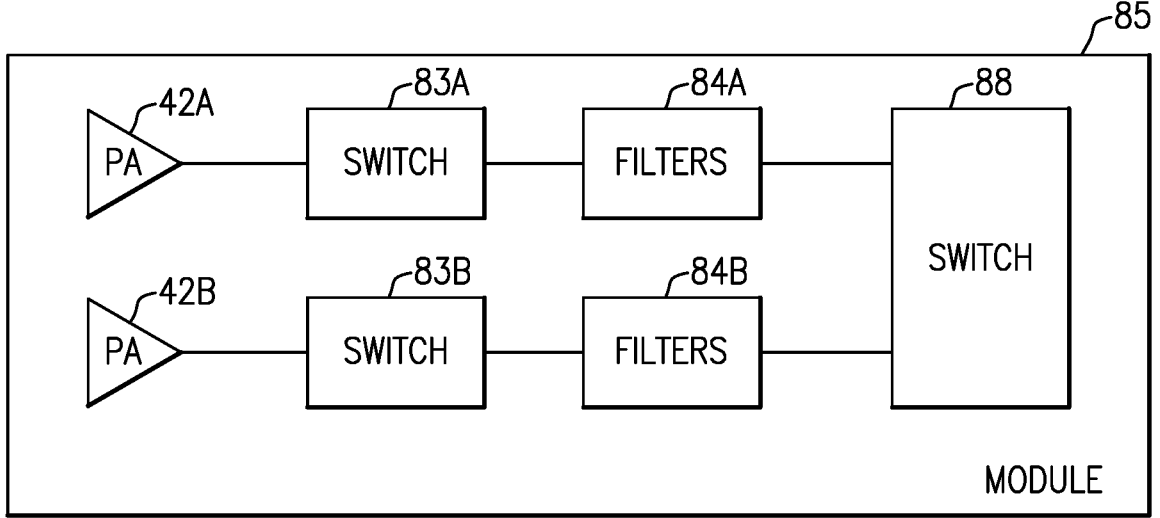
FIG. 3B is a schematic block diagram of a module that includes a filter.

The filters discussed herein can be implemented in a variety of packaged modules. Some example packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, the switch 83, and the filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 18A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, an additional switch 83B, and additional filters 84B. The different RF signal paths can be associated with different frequency bands and/or different modes of operation (e.g., different power modes, different signaling modes, etc.).

In recent years, in the field of information communication devices such as mobile phones, acoustic wave devices having a comb-shaped IDT electrode formed on a surface of a piezoelectric substrate are used as circuit elements such as resonators, filters, and the like.

Figure 4:
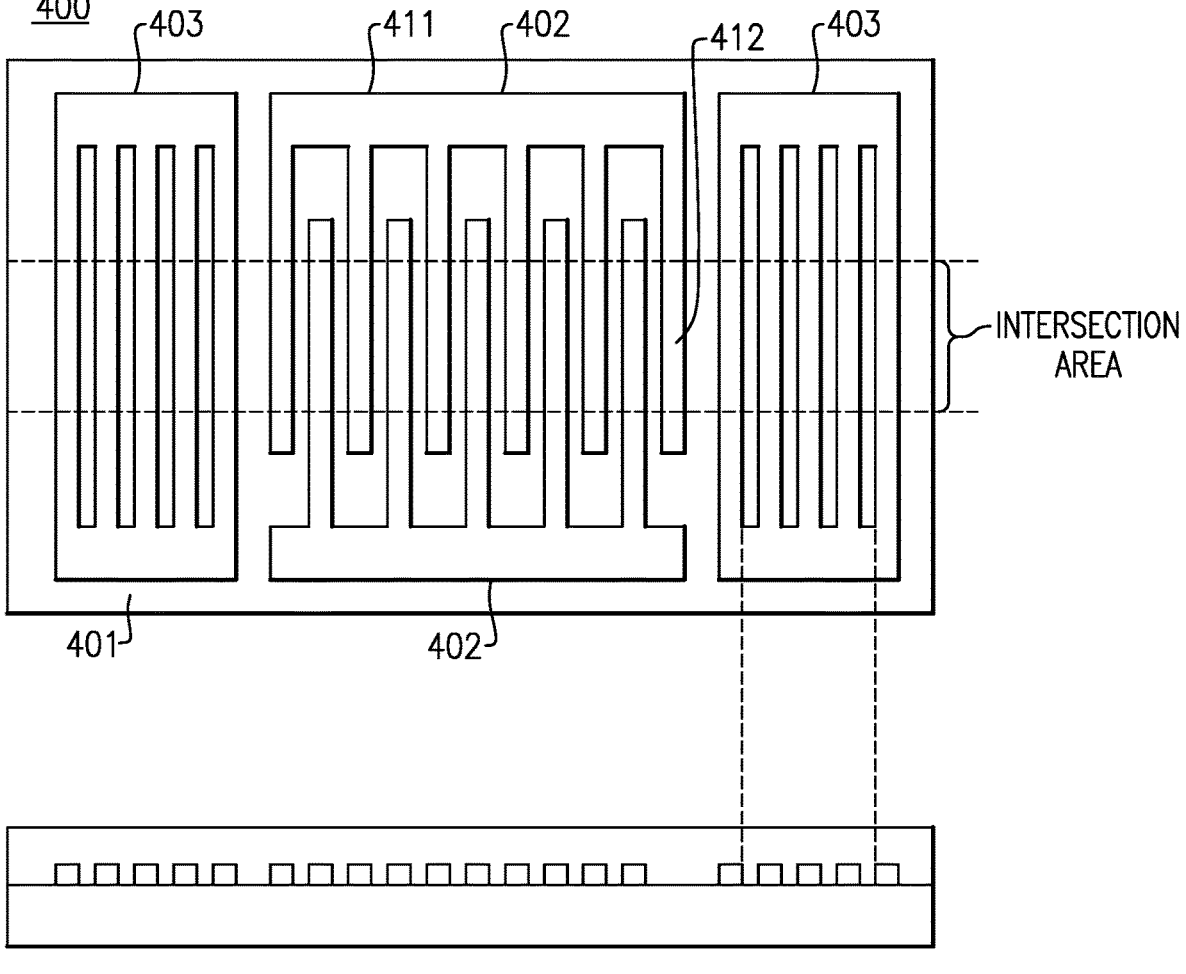
FIG. 4 is an example of schematic diagram of acoustic wave device.

FIG. 4 shows examples of such acoustic wave devices. In FIG. 4, a top view of an acoustic wave device 400 is shown.

In this description, the acoustic wave device 400 can be also referred to as a resonator. The acoustic wave device 400 is formed by arranging two IDT electrodes 402 and two reflectors 403 on a piezoelectric substrate 401. The IDT electrodes 402 each have a bus bar 411 and a plurality of electrode fingers 412 that extend from the bus bar 411. The respective electrode fingers 412 of each of the IDT electrodes 402 are arranged such that the electrode fingers 412 thereof are arranged interleaved with the respective electrode fingers 412 of the other IDT electrode 402. The reflectors 403 are arranged so as to interpose the IDT electrodes 902 therebetween.

Figures 5, 6:
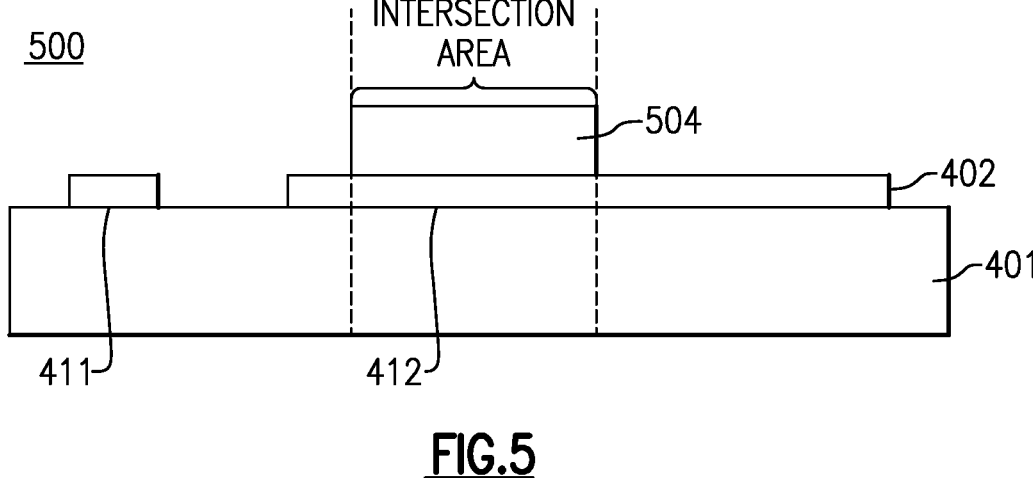
FIG. 5 is a sectional view of the acoustic wave device aligned along a single electrode finger.
FIG. 6 is a sectional view of the acoustic wave device aligned along a single electrode finger.

FIG. 5 is a sectional view of an acoustic wave device 500 aligned along a single electrode finger 412. In the acoustic wave device 500, propagation of an acoustic wave is concentrated to the coating film 504, thereby suppressing an undesired high-order transverse mode wave.

FIG. 6 is a sectional view of an acoustic wave device 600 aligned along a single electrode finger 412. The acoustic wave device 600 is different from the acoustic wave device 500 of FIG. 5 in that a dielectric film 604 covers the piezoelectric substrate 401, the IDT electrodes 402, and the reflectors 403 such that the surface thereof is flattened. In the acoustic wave device 600, the dielectric film 604 covers the piezoelectric substrate 601, thereby reducing temperature-dependent frequency characteristic changes of the acoustic wave device 600.

An acoustic wave device with a dielectric film for reducing the impact by temperature variation may be referred to as temperature-compensated surface acoustic wave device, i.e. TC-SAW resonator. Hereinafter, a temperature-compensated acoustic wave device with improved quality (Q) factor in smaller size is described.

Figure 7A:
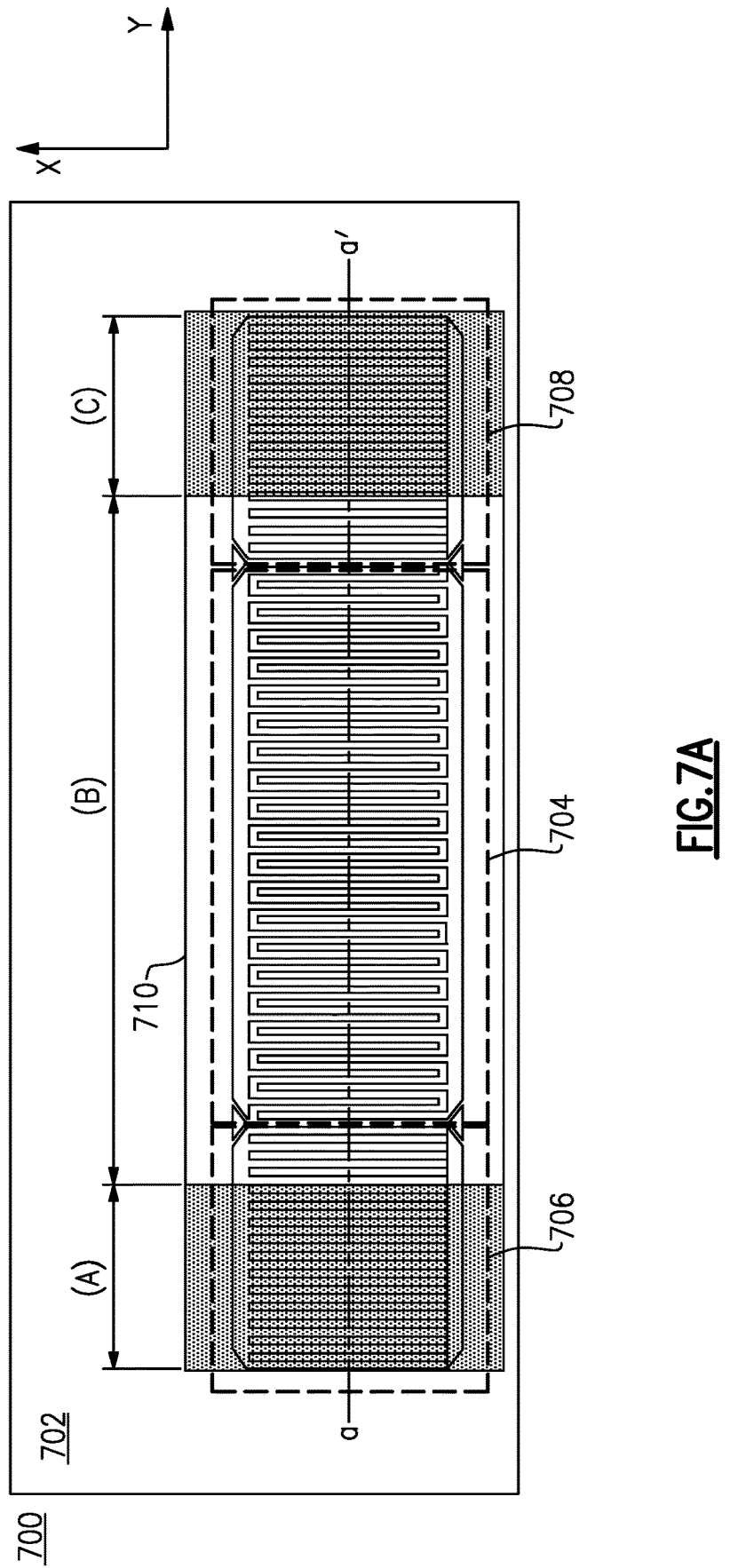
FIG. 7A is a schematic diagram of an example of an acoustic wave device according to an embodiment of the present disclosure.
Figure 7B:
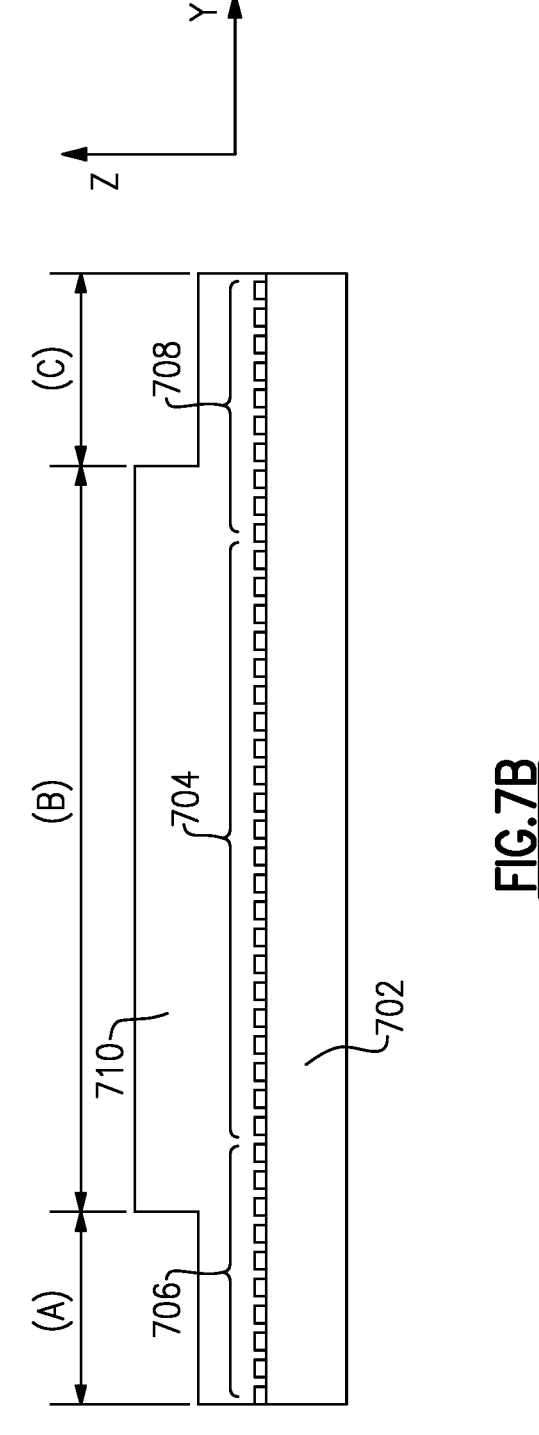
FIG. 7B shows a sectional view of the acoustic wave device along the line (a)-(a') of FIG. 7A.

FIG. 7A is a schematic diagram of an example of an acoustic wave device according to an embodiment of the present disclosure. FIG. 7B shows a sectional view of the acoustic wave device along the line (a)-(a') of FIG. 7A.

The acoustic wave device 700 may include a substrate 702, a pair of IDT electrodes 704, reflectors 706, 708, and a dielectric film 710.

The substrate 702 may be a piezoelectric substrate. The substrate 702 may be formed of lithium niobate.

The pair of IDT electrodes 704 may be formed on the substrate 702. The pair of IDT electrodes 704 may be disposed along a surface of the substrate 702. Each of the pair of IDT electrodes 704 may include a bus bar and a plurality of fingers extending from the bus bar. The bus bar and the fingers of each IDT electrode may be implemented similarly as the ones of the acoustic wave device of FIG. 4. In that regard, reference is made to the descriptions and explanations of FIG. 4.

A respective finger of one IDT electrode 704 may be arranged interleaved with respective fingers of the other IDT electrode 704. Each finger of the first pair of IDT electrodes 704 may be interleaved with respective fingers to have a gap of a first pitch distance. In other words, each of the respective finger of one IDT electrode 704 may be separated from adjacent fingers of another IDT electrode 704 by the first pitch distance. The pitch distance is defined as the gap between adjacent fingers of each IDT electrode 704 that is constant throughout the pair of IDT electrodes 704.

The reflectors 706, 708 may be formed on the substrate 702.

According to an embodiment, the pair of IDT electrodes 704 and the reflectors 706, 708 may be arranged along a propagation direction of a main acoustic wave. In this example, the propagation direction of the main acoustic wave is perpendicular to a direction of extension of the plurality of fingers of the pair of IDT electrodes 704. As shown in FIG. 7, and without limiting generality, the propagation direction may be y direction, and the direction of extension may be x direction (±x direction).

The reflectors 706, 708 may include a plurality of fingers separated from each other by a second pitch distance. The plurality of fingers of the reflectors 706, 708 may be extending in a same direction of extension of the plurality of fingers of the pair of IDT electrodes 704. The fingers of the reflectors 706, 708 may be extending in ±x direction. According to an embodiment, the second pitch distance may be larger than the first pitch distance.

The dielectric film 710 may be disposed so as to cover the pair of IDT electrodes 704 and the reflectors 706, 708. The dielectric film 710 may be formed of silicon dioxide. The dielectric film 710 may have different thicknesses depending on the area of coverage of the corresponding region of the dielectric film 710. The reflection coefficient can be controlled by the thickness of the dielectric film 710. For example, the reflection coefficient may be improved by making the film thickness thinner. Thus, if it is desired to design an acoustic wave device with reduced reflection coefficient, the thickness of the dielectric film 710 can be increased. According to an embodiment, the dielectric film 710 may have more than 2 regions (for example 3 or 4 distinct regions) with different thicknesses. The thickness of the dielectric film 710 may be defined in a direction perpendicular to the surface of the substrate 702. The thickness of the dielectric film 710 may be measured in z direction as shown in FIG. 7B.

According to an embodiment, at least a portion of the reflectors 706, 708 may be covered by the dielectric film 710 of a first thickness, and the pair of IDT electrodes 704 may be covered by the dielectric film 710 of a second thickness. The first thickness may be less than the second thickness.

In one embodiment, the portion of the reflectors 706, 708 covered by the dielectric film 710 of the first thickness may be end portions (A), (C) of each reflector remote from the pair of IDT electrodes 704, as indicated in FIGS. 7A, 7B by the shaded areas on both sides of the IDT electrodes 704. In some embodiments, the end portion (A) of one reflector may be covered by the dielectric film of the first thickness, and the end portion (C) of the other reflector may be covered by the dielectric film of a third thickness, where the third thickness is different than the first thickness, or different than the first thickness or the second thickness. In some embodiments, the third thickness may be greater than the first thickness and less than the second thickness. It should be appreciated that other embodiments may include a third thickness where the third thickness is less than the first thickness.

Furthermore, some inner portions of the reflectors 706, 708 may be covered by the dielectric film 710 of the second thickness. The inner portions of each reflector may be the portions adjacent to the pair of IDT electrodes 704. The inner portions of the reflectors 706, 708 and the pair of IDT electrodes 704 may be covered by the dielectric film 710 of the second thickness, as indicated by (B) in FIGS. 7A, 7B. In FIG. 7B, each of the reflectors 706, 708 may have two areas covered by different thicknesses of the dielectric film 710.

According to this embodiment, the boundary between the reflectors 706, 708 and the pair of IDT electrodes 704 may not correspond to a transition region connecting the first thickness and the second thickness of the dielectric film 710. The surface of the dielectric film 710 may have a stair shape at the transition region connecting the first thickness and the second thickness of the dielectric film 710. In this example, the surface of the dielectric film 710 may have a vertical surface. The surface of the dielectric film 710 may have a sloped shape at the transition region connecting the first thickness and the second thickness of the dielectric film 710. In this example, the surface of the dielectric film 710 may have an angled surface having a third thickness. According to an embodiment, an average of the third thickness over the angled surface may be less than the second thickness.

According to embodiments, the reflectance coefficient of the thin portion of dielectric film can be improved, the number of reflectors can be reduced, and therefore the size of the device can be reduced and the quality (Q) factor of the device also can be improved.

Figure 8A:
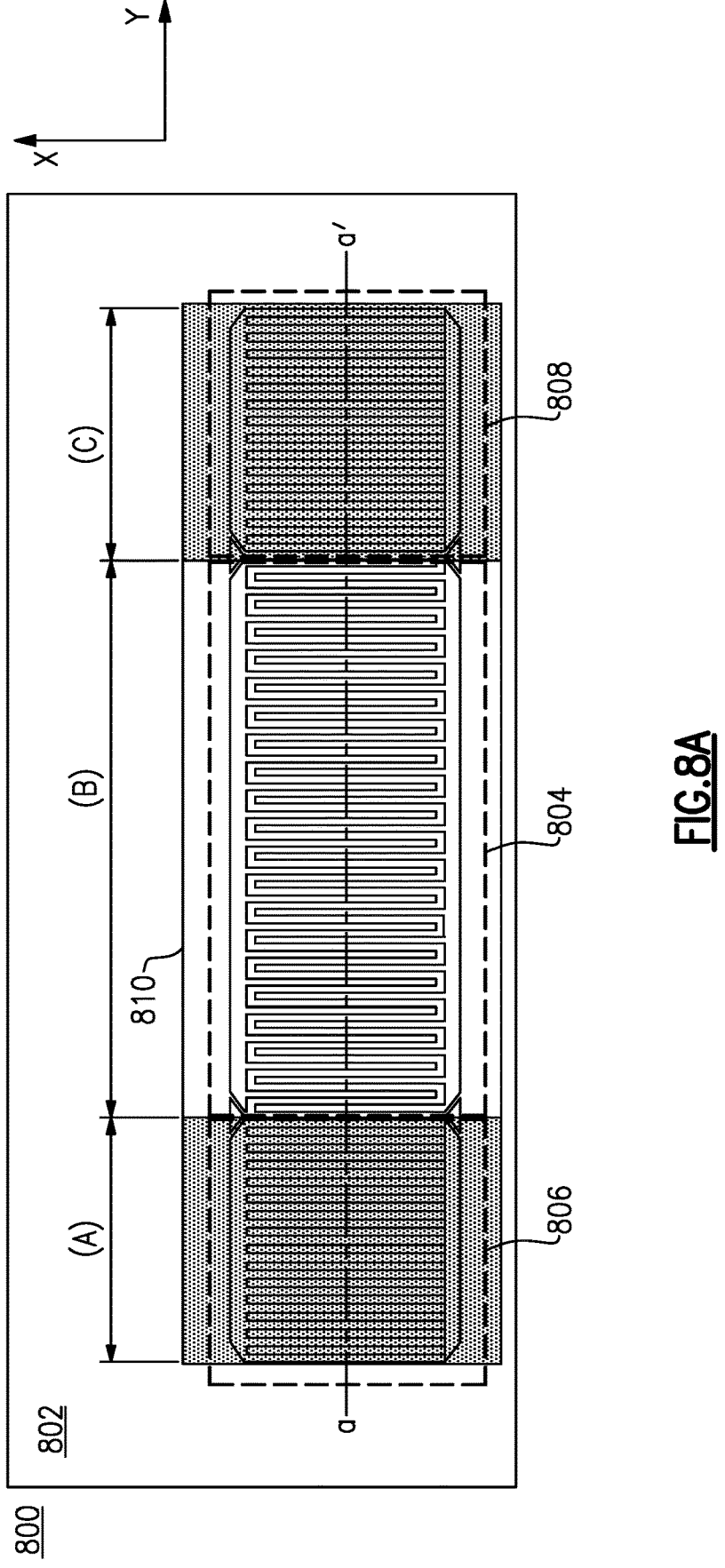
FIG. 8A is a schematic diagram of an example of an acoustic wave device with adjusted area with the first thickness of dielectric film.
Figure 8B:
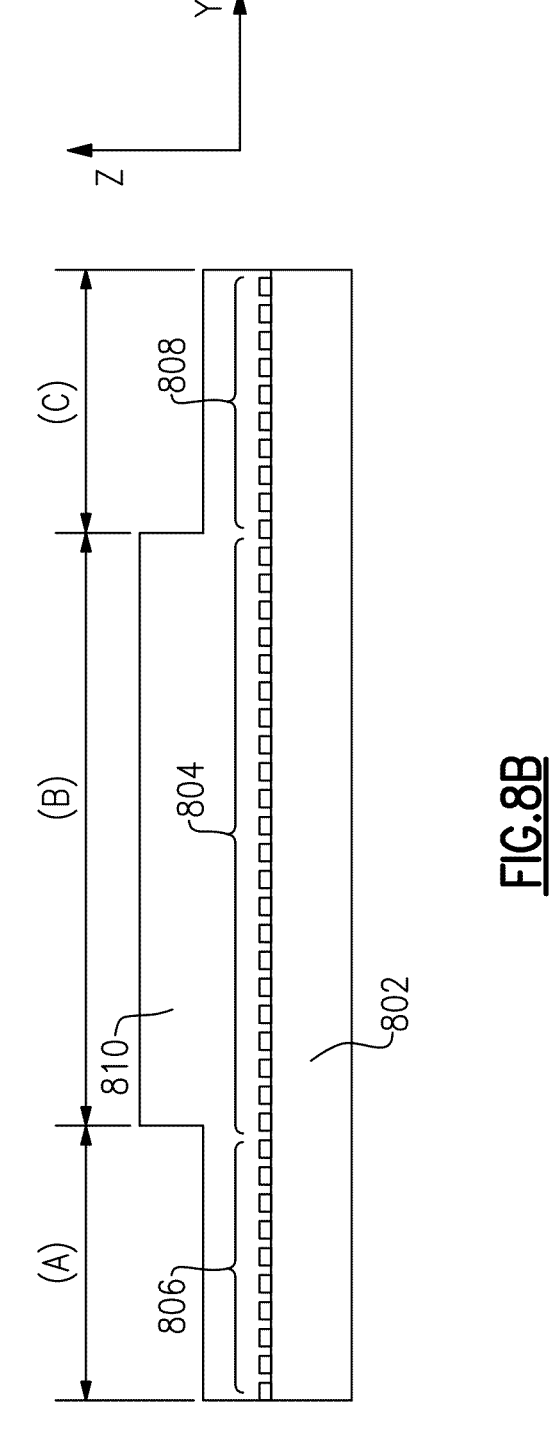
FIG. 8B shows a sectional view of the acoustic wave device along the line (a)-(a') of FIG. 8A.

FIG. 8A is a schematic diagram of an example of an acoustic wave device with adjusted area with the first thickness of dielectric film. FIG. 8B shows a sectional view of the acoustic wave device along the line (a)-(a') of FIG. 8A.

The acoustic wave device 800 may include a substrate 802, a pair of IDT electrodes 804, reflectors 806, 808, and a dielectric film 810, similar to the acoustic wave device 700 shown in FIG. 7.

In FIGS. 8A, 8B, all of the reflectors 706, 708 may be covered by the dielectric film 810 of first thickness. Depending on the requirements of the device or manufacturing circumstances, the range of first thickness of the dielectric film 810 can be adjusted. However, the pair of IDT electrodes 704 may not be covered by the dielectric film 810 of the first thickness.

According to embodiments, the reflectance coefficient of the thin portion of dielectric film can be improved, the number of reflectors can be reduced, and therefore the size of the device can be reduced and the quality (Q) factor of the device also can be improved.

Figure 9A:
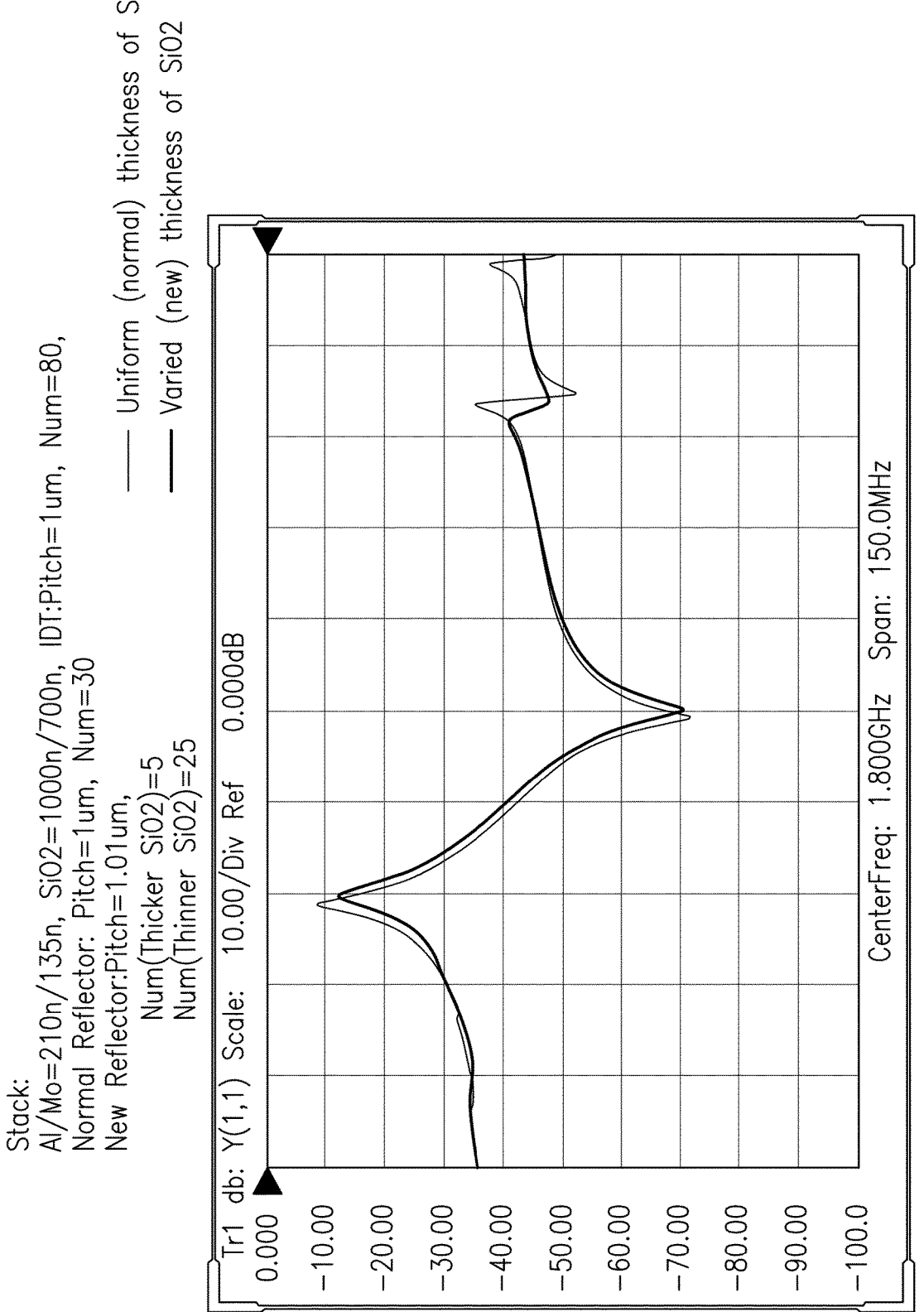
FIG. 9A shows a frequency characteristic of an exemplary filter module comprising the acoustic wave device according to an embodiment of the present disclosure.
Figure 9B:
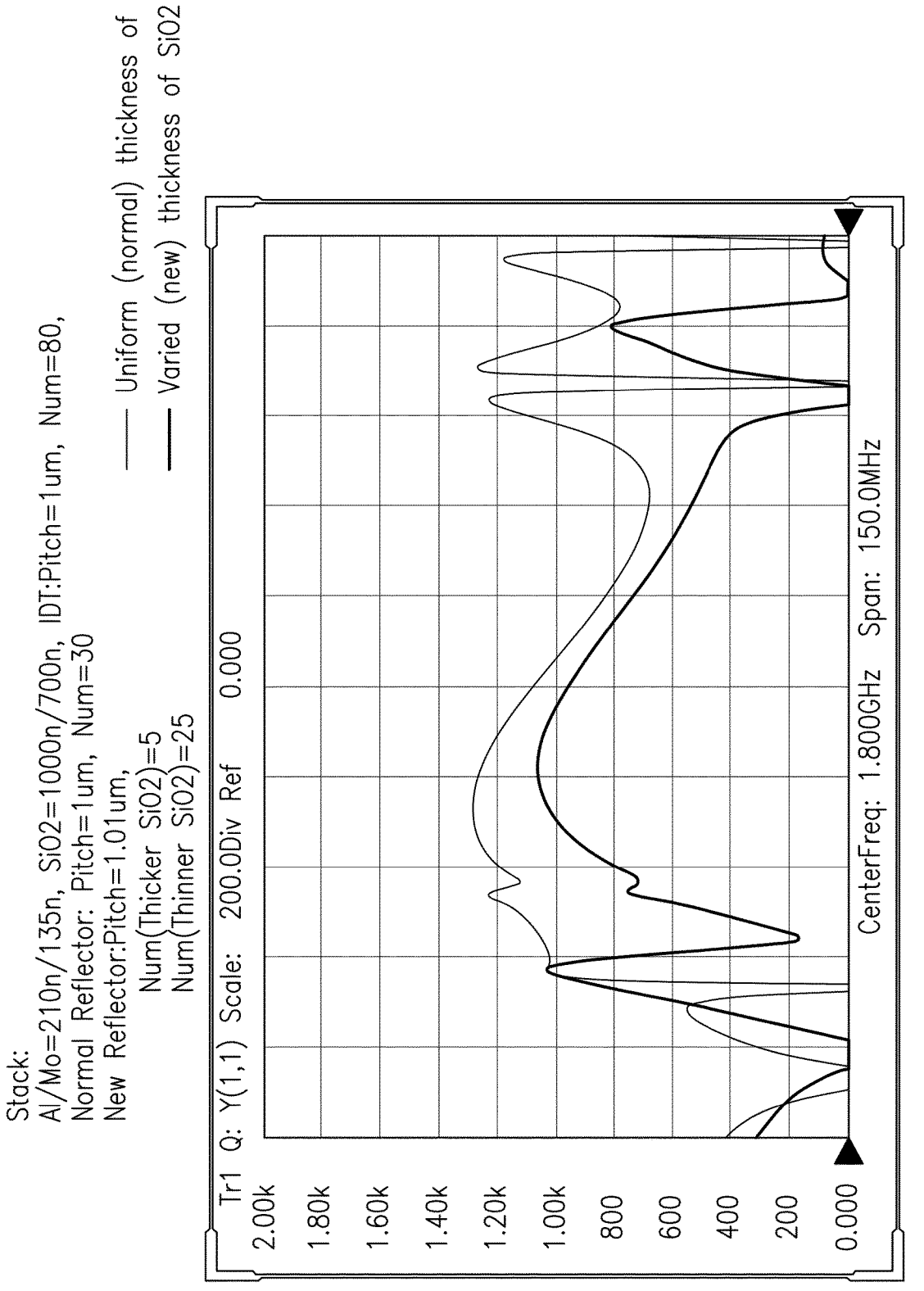
FIG. 9B shows a quality (Q) factor of an exemplary filter module comprising the acoustic wave device according to an embodiment of the present disclosure.
Figure 9C:
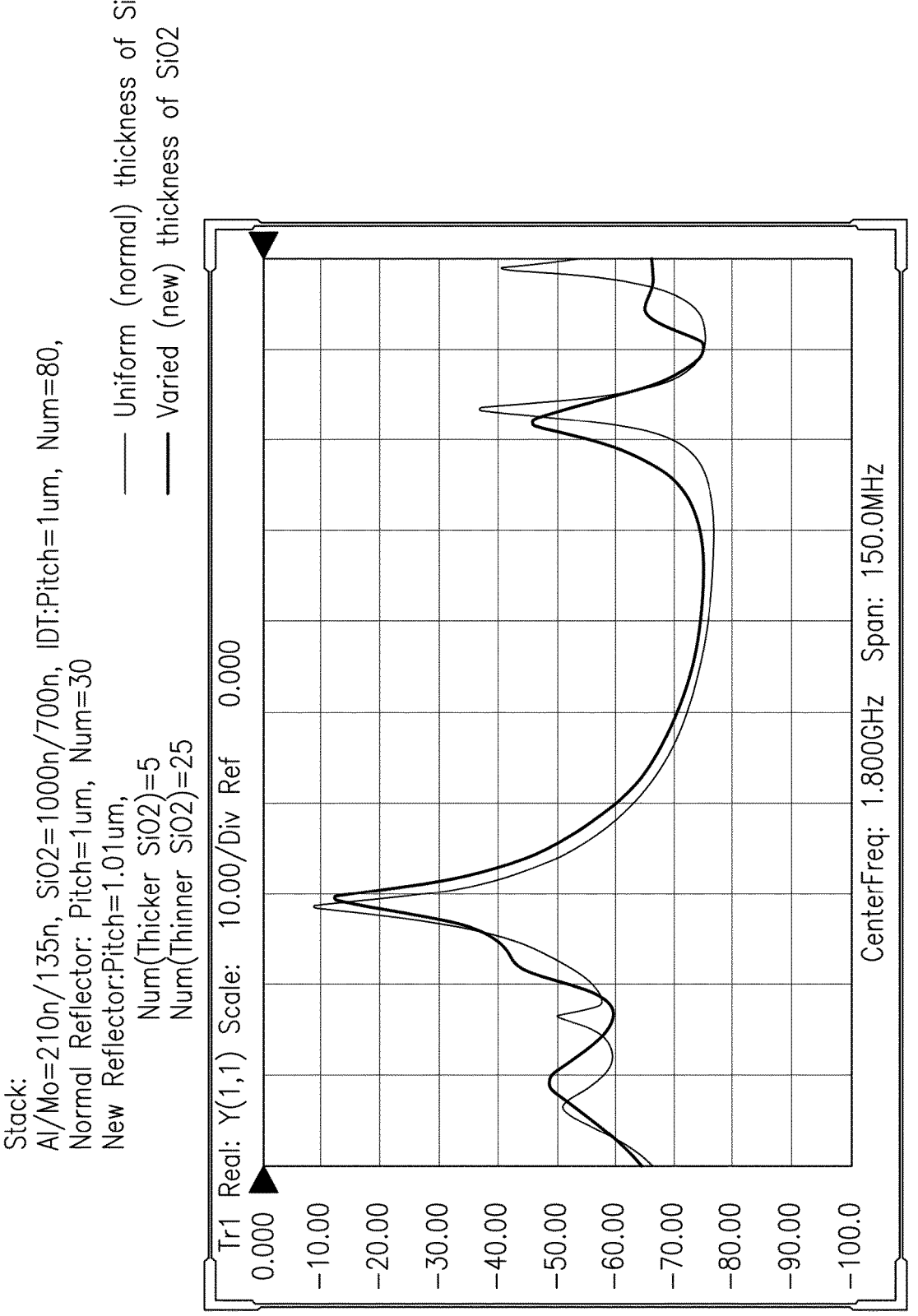
FIG. 9C shows a frequency characteristic of another exemplary filter module comprising the acoustic wave device according to an embodiment of the present disclosure.

FIG. 9A shows a frequency characteristic of an exemplary filter module comprising the acoustic wave device according to an embodiment of the present disclosure. FIG. 9B shows a quality (Q) factor of an exemplary filter module comprising the acoustic wave device according to an embodiment of the present disclosure. FIG. 9C shows a frequency characteristic of another exemplary filter module comprising the acoustic wave device according to an embodiment of the present disclosure.

Figure 10A:
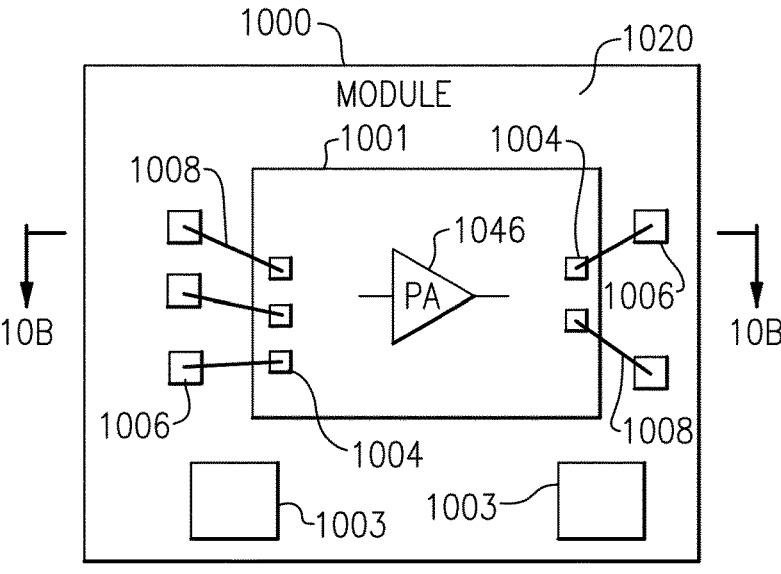
FIG. 10A is a schematic diagram of one embodiment of a packaged module.
Figure 10B:
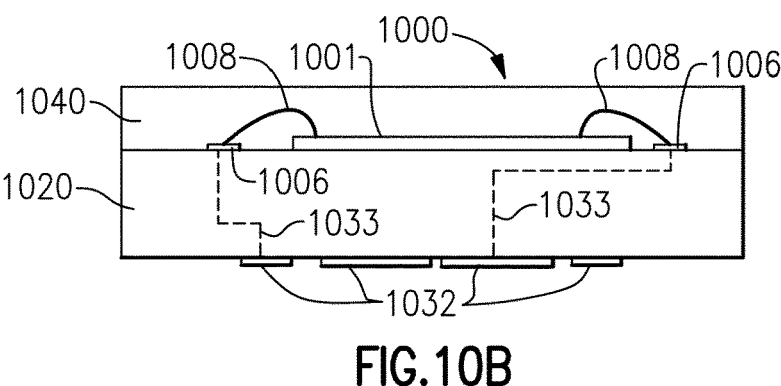
FIG. 10B is a schematic diagram of a cross-section of the packaged module of FIG. 10A taken along the lines 10B-10B.

FIG. 10A is a schematic diagram of one embodiment of a packaged module 1000. FIG. 10B is a schematic diagram of a cross-section of the packaged module 1000 of FIG. 10A taken along the lines 10A-10B.

The packaged module 1000 includes an IC or die 1001, surface mount components 1003, wirebonds 1008, a package substrate 1020, and encapsulation structure 1040. The package substrate 1020 includes pads 1006 formed from conductors disposed therein. Additionally, the die 1001 includes pads 1004, and the wirebonds 1008 have been used to electrically connect the pads 1004 of the die 1001 to the pads 1006 of the package substrate 1001.

The die 1001 includes a filter module, which can be implemented in accordance with any of the embodiments herein.

The packaging substrate 1020 can be configured to receive a plurality of components such as the die 1001 and the surface mount components 1003, which can include, for example, surface mount capacitors and/or inductors.

As shown in FIG. 10B, the packaged module 1000 is shown to include a plurality of contact pads 1032 disposed on the side of the packaged module 1000 opposite the side used to mount the die 1001. Configuring the packaged module 1000 in this manner can aid in connecting the packaged module 1000 to a circuit board such as a phone board of a wireless device. The example contact pads 1032 can be configured to provide RF signals, bias signals, power low voltage(s) and/or power high voltage(s) to the die 1001 and/or the surface mount components 1003. As shown in FIG. 10B, the electrical connections between the contact pads 1032 and the die 1001 can be facilitated by connections 1033 through the package substrate 1020. The connections 1033 can represent electrical paths formed through the package substrate 1020, such as connections associated with vias and conductors of a multilayer laminated package substrate.

In some embodiments, the packaged module 1000 can also include one or more packaging structures to, for example, provide protection and/or facilitate handling of the packaged module 1000. Such a packaging structure can include overmold or encapsulation structure 1040 formed over the packaging substrate 1020 and the components and die(s) disposed thereon.

It will be understood that although the packaged module 1000 is described in the context of electrical connections based on wirebonds, one or more features of the present disclosure can also be implemented in other packaging configurations, including, for example, flip-chip configurations.

Figure 11:
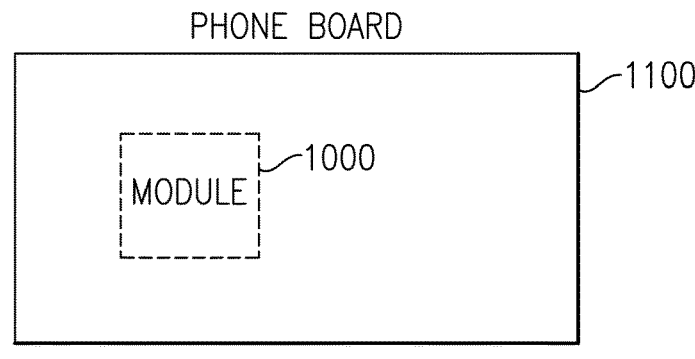
FIG. 11 is a schematic diagram of one embodiment of a phone board.

FIG. 11 is a schematic diagram of one embodiment of a phone board 1100. The phone board 1100 includes the module 1000 shown in FIGS. 10A-10B attached thereto. Although not illustrated in FIG. 11 for clarity, the phone board 1100 can include additional components and structures.

Applications

Some of the embodiments described above have provided examples in connection with wireless devices or mobile phones. However, the principles and advantages of the embodiments can be used for any other systems or apparatus that have needs for power amplifiers.

Such acoustic wave devices and filters can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An acoustic wave device comprising:
a substrate;
a pair of IDT electrodes formed on the substrate, each of the pair of IDT electrodes including a bus bar and a plurality of fingers extending from the bus bar, a respective finger of one IDT electrode arranged interleaved with respective fingers of the other IDT electrode;
reflectors formed on the substrate, one of the reflectors being adjacent to one side of the pair of IDT electrodes and another reflector being adjacent to an opposite side of the pair of IDT electrodes so as to interpose the pair of IDT electrodes therebetween, the reflectors and the pair of IDT electrodes arranged along a propagation direction of a main acoustic wave; and
a dielectric film covering the pair of IDT electrodes and the reflectors, the dielectric film having a first thickness over at least a portion of the reflectors, the dielectric film having a second thickness over an entirety of the pair of IDT electrodes, the first thickness being different from the second thickness.

2. The acoustic wave device of claim 1 wherein each of the reflectors includes an inner portion and an end portion, the end portion being disposed further from the pair of IDT electrodes than the inner portion, the portion of the reflectors covered by the dielectric film of the first thickness being the end portion of each reflector.

3. The acoustic wave device of claim 2 wherein the inner portion of each reflector is covered by the dielectric film of the second thickness that is thicker than the first thickness.

4. The acoustic wave device of claim 1 wherein the dielectric film of the first thickness covers an entirety of the reflectors.

5. The acoustic wave device of claim 1 wherein the respective finger of one IDT electrode is separated from an adjacent finger of the other IDT electrode by a first pitch distance, each of the reflectors including a plurality of fingers separated from each other by a second pitch distance which are extending in a same direction of extension as the respective finger of the pair of IDT electrodes.

6. The acoustic wave device of claim 5 wherein the second pitch distance is larger than the first pitch distance.

7. The acoustic wave device of claim 1 wherein the dielectric film is formed of silicon dioxide ($SiO_2$).

8. The acoustic wave device of claim 1 wherein a surface of the dielectric film has a stair shape at a transition region connecting the first thickness and the second thickness of the dielectric film.

9. The acoustic wave device of claim 1 wherein each of the reflectors includes an inner portion and an end portion, the end portion being disposed further from the pair of IDT electrodes than the inner portion, the portion of the reflectors covered by the dielectric film of the first thickness being the end portion of one of the reflectors, and the end portion of the other reflector is covered by the dielectric film of a third thickness that is different from the first thickness.

10. A radio frequency module comprising:
a packaging board configured to receive a plurality of components; and
an acoustic wave device implemented on the packaging board, the acoustic wave device including a substrate, a pair of IDT electrodes formed on the substrate, each of the pair of IDT electrodes including a bus bar and a plurality of fingers extending from the bus bar, a respective finger of one IDT electrode arranged interleaved with respective fingers of the other IDT electrode, reflectors formed on the substrate, one of the reflectors being adjacent to one side of the pair of IDT electrodes and another reflector being adjacent to an opposite side of the pair of IDT electrodes so as to interpose the pair of IDT electrodes therebetween, the reflectors and the pair of IDT electrodes arranged along a propagation direction of a main acoustic wave, and a dielectric film covering the pair of IDT electrodes and the reflectors, the dielectric film having a first thickness over at least a portion of the reflectors, and a second thickness over an entirety of the pair of IDT electrodes, the first thickness being different from the second thickness.

11. The radio frequency module of claim 10 wherein each of the reflectors includes an inner portion and an end portion, the end portion being disposed further from the pair of IDT electrodes than the inner portion, the portion of the reflectors covered by the dielectric film of the first thickness being the end portion of one of the reflectors, and the end portion of the other reflector is covered by the dielectric film of a third thickness that is different from the first thickness.

12. The radio frequency module of claim 10 wherein the radio frequency module is a front-end module.

13. The radio frequency module of claim 12 wherein inner portions of each reflector adjacent to the pair of IDT electrodes are covered by the dielectric film of the second thickness that is thicker than the first thickness.

14. The radio frequency module of claim 10 wherein the dielectric film of the first thickness covers an entirety of the reflectors.

15. The radio frequency module of claim 10 wherein the respective finger of one IDT electrode is separated from an adjacent finger of the other IDT electrode by a first pitch distance, each of the reflectors including a plurality of fingers separated from each other by a second pitch distance which are extending in a same direction of extension as the respective finger of the pair of IDT electrodes.

16. The radio frequency module of claim 15 wherein the second pitch distance is larger than the first pitch distance.

17. A mobile device comprising:
an antenna configured to receive a radio frequency signal; and
a front end system configured to communicate with the antenna, the front end system including an acoustic wave device including a substrate, a pair of IDT electrodes formed on the substrate, each of the pair of IDT electrodes including a bus bar and a plurality of fingers extending from the bus bar, a respective finger of one IDT electrode arranged interleaved with respective fingers of the other IDT electrode, reflectors formed on the substrate, one of the reflectors being adjacent to one side of the pair of IDT electrodes and another reflector being adjacent to an opposite side of the pair of IDT electrodes so as to interpose the pair of IDT electrodes therebetween, the reflectors and the pair of IDT electrodes arranged along a propagation direction of a main acoustic wave, and a dielectric film covering the pair of IDT electrodes and the reflectors, the dielectric film having a first thickness over at least a portion of the reflectors, the dielectric film having a second thickness over an entirety of the pair of IDT electrodes, the first thickness being different from the second thickness.

18. The mobile device of claim 17 wherein each of the reflectors includes an inner portion and an end portion, the end portion being disposed further from the pair of IDT electrodes than the inner portion, the portion of the reflectors covered by the dielectric film of the first thickness being the end portion of one of the reflectors, and the end portion of the other reflector is covered by the dielectric film of a third thickness that is different from the first thickness.

19. The mobile device of claim 17 wherein the respective 5 finger of one IDT electrode is separated from an adjacent finger of the other IDT electrode by a first pitch distance, each of the reflectors including a plurality of fingers separated from each other by a second pitch distance which are extending in a same direction of extension as the respective 10 finger of the pair of IDT electrodes, the second pitch distance being larger than the first pitch distance.

\* \* \* \* \*